United States Patent [19]
Ishii

[11] Patent Number: 5,701,228
[45] Date of Patent: Dec. 23, 1997

[54] STAGE SYSTEM OR DEVICE

[75] Inventor: Nobuo Ishii, Yamanashi-ken, Japan

[73] Assignee: Tokyo Electron Limited, Tokyo, Japan

[21] Appl. No.: 616,305

[22] Filed: Mar. 15, 1996

[30] Foreign Application Priority Data

Mar. 17, 1995 [JP] Japan .................................. 7-086101

[51] Int. Cl.$^6$ .............................................. H02N 13/00
[52] U.S. Cl. .......................................................... 361/234
[58] Field of Search .................................. 361/233, 234; 269/8, 903; 279/128

[56] References Cited

U.S. PATENT DOCUMENTS

| | | | |
|---|---|---|---|
| 5,382,469 | 1/1995 | Kubota et al. | 361/234 |
| 5,384,681 | 1/1995 | Kitabayashi et al. | 361/234 |
| 5,384,682 | 1/1995 | Watanabe et al. | 361/234 |
| 5,463,526 | 10/1995 | Mundt | 361/234 |

FOREIGN PATENT DOCUMENTS

| | | |
|---|---|---|
| 5-243367 | 9/1993 | Japan . |
| 6-737 | 1/1994 | Japan . |
| 6-8089 | 1/1994 | Japan . |
| 7-183277 | 7/1995 | Japan . |

*Primary Examiner*—Fritz Fleming
*Attorney, Agent, or Firm*—Oblon, Spivak, McClelland, Maier & Neustadt, P.C.

[57] ABSTRACT

A stage device or system comprising an electrostatic chuck portion having a substrate-mounted face made of ceramics, a support block continuous from the bottom of the electrostatic chuck portion and made integral to it, an insulating section for electrically insulating the electrostatic chuck portion from other members, at least an electrode embedded in the electrostatic chuck portion and serving to generate charge on the substrate-mounted face, when DC voltage is applied to it, to attract and hold a substrate on the face, and oxide or resistibility reducing materials added to the ceramics to reduce resistibility of the ceramics forming the electrostatic chuck portion to remove charge from the substrate-mounted face when the substrate is to be released from the face, wherein the amount of oxide or conductive particles contained in the ceramics becomes gradually smaller as it comes from the electrode nearer to the support block.

22 Claims, 3 Drawing Sheets

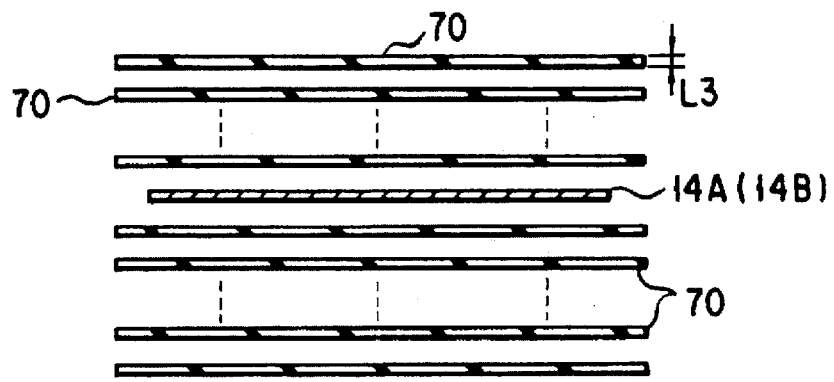
F I G. 3
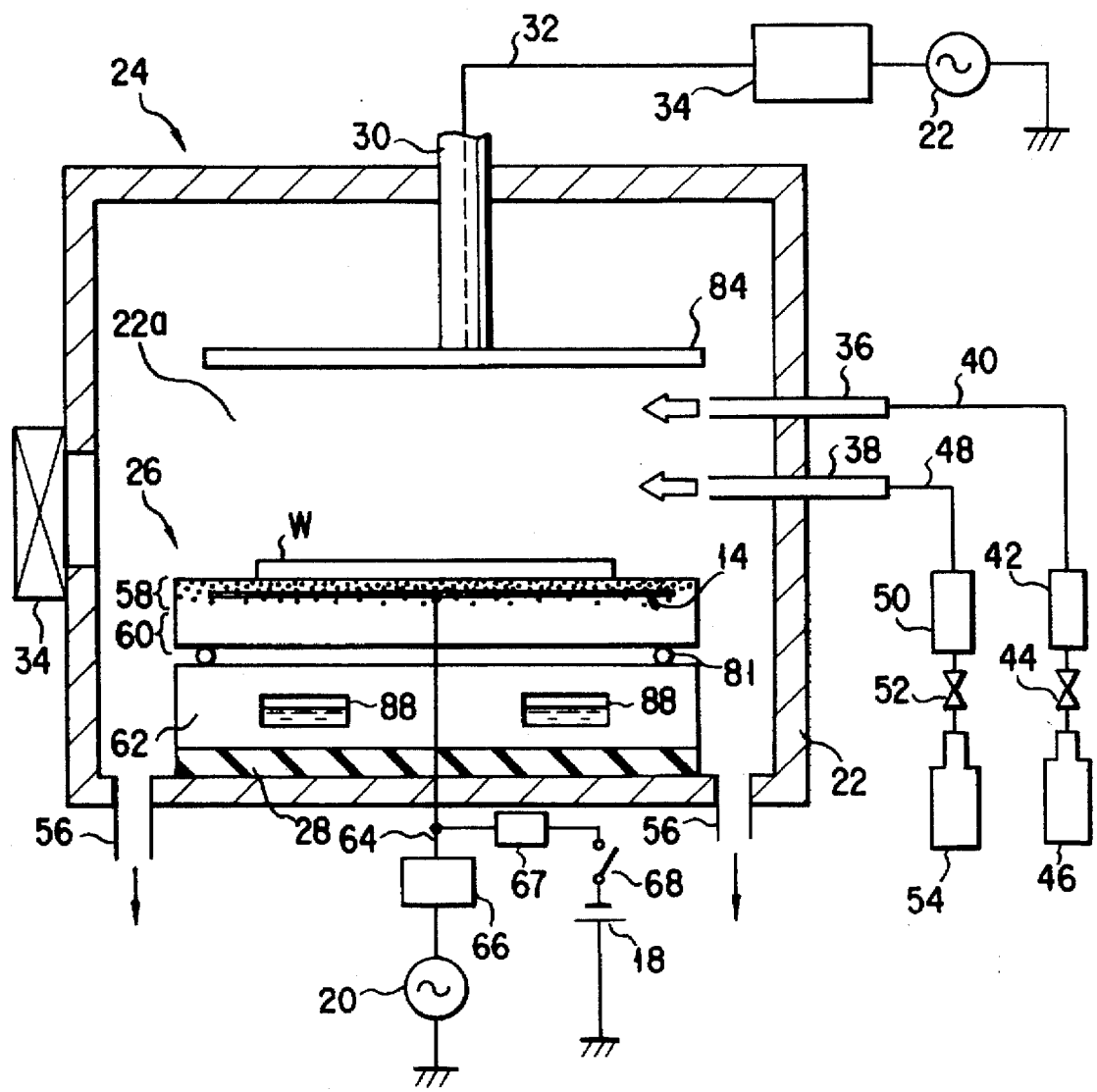
F I G. 5

STAGE SYSTEM OR DEVICE

BACKGROUND OF THE INVENTION

1. Field of the Invention

The present invention relates to a stage device or system provided with an electrostatic chuck to suck and hold a substrate such as the LCD one and semiconductor wafer when the system is incorporated in the etching or CVD (chemical vapor deposition) apparatus. 2. Description of the Related Art When the semiconductor wafer or LCD substrate is to be film-forming- or etching-processed by the CVD film-forming or plasma-etching apparatus, it is usually mounted on a horizontal stage. The horizontal stage has an electrostatic chuck to attract and hold the wafer or LCD substrate on the stage by electrostatic attraction (or Coulomb force).

This electrostatic chuck generates electrostatic charge in such a way that both faces of a disk-like thin plate electrode is coated by thin insulating film and that high DC voltage is applied to it. Polyimide resin has been used as the insulating film for the electrostatic chuck. However, its durability is low and its life is relatively short when it is used under severe process conditions such as plasma discharged.

Recently, therefore, ceramic material, more excellent in durability, is used instead of polyimide resin. The electrostatic chuck made of ceramics comprises embedding the copper-made and disk-like thin plate electrode in the ceramic material and bonding it by insulating adhesive. A DC power source is connected to the copper-made electrode and when DC power is applied to the electrode, positive or negative charge is caused on a ceramics-made and substrate-mounted face of the electrostatic chuck to thereby suck the substrate on the face.

When the wafer W is to be carried out of the process chamber, however, charge must be removed from the substrate-mounted face, on which the wafer W is sucked and held, to quickly release the wafer W from the face. In the case of the conventional stage system, however, charge remains on the ceramic material even after the DC power source is turned OFF. The wafer W is thus left sucked on the substrate-mounted face to thereby make it difficult to release the wafer W from the stage.

When an insulating section of the electrostatic chuck portion is made conductive to make it easy to remove charge from the substrate-mounted face, leak current 15b is caused, not passing through the substrate W but leaking from a plus-side electrode to another minus-side one, in the case of the electrostatic chuck portion of the bi-polar type. The substrate-sucking and holding force is thus reduced.

Further, when an adhesive having a high bonding strength is used to bond the copper electrode to the ceramic material, the ceramic material may be broken by the difference of linear expansibility of the ceramic material relative to the copper electrode during the thermal cycle process. When another adhesive having a low bonding strength is used, however, it becomes quickly useless during the thermal cycle process, thereby causing the stage to be made short in life.

SUMMARY OF THE INVENTION

An object of the present invention is to provide a stage device or system capable of more quickly removing electrostatic charge from the substrate-mounted face, without causing any leak current, to more easily release the substrate from the face.

Another object of the present invention is to provide a stage device or system, less in deterioration but more excellent in durability and longer in life, even when it is used for a long time.

The inventor of the present invention has tried to add and mix resistibility reducing materials in that section of the ceramic material which is in the vicinity of the substrate-mounted face and make the face a little conductive to remove remaining charge from the face. As the result, it has been found that carbon, silicon and tungsten particles are more suitable for the conductive ones. To add more, however, it is preferable that the diameter of each resistibility reducing material is in a range of 0.01–10 μm.

It has also been found that ceramics of the alumina group are more suitable for the substrate-mounted portion. The reason resides in that the substrate-mounted face made of alumina ($Al_2O_3$) has an inherent contact resistance rate (Ω.cm), so large, relative to the wafer W as to gain a predetermined electrostatic attraction even under a condition that resistibility reducing materials are contained in the face.

On the other hand, that portion of the support block which does not form the substrate-mounted face must have a high insulation to prevent high bias frequency from being leaked. The inventor, therefore, has found that aluminum nitride (AlN) is more suitable as ceramics for this portion of the support block when high insulation and heat conductivity are taken into consideration.

As the size of wafer becomes larger to 8 and 12 inches, the diameter of stage must also be made larger. That section of the electrostatic chuck portion which is bonded to the support block becomes a trouble in this case. Instead of adhesive, the inventor attached the rim of the electrostatic chuck portion to the support block by screws. However, thermal expansion difference is caused between the screwed rim area of the chuck portion and the not-screwed center area thereof to thereby cause the electrostatic chuck portion to be broken. He, therefore, has earnestly studied on such a structure of the chuck portion that causes no thermal expansion difference. As the result, he has made the electrostatic chuck portion integral to the support block.

A stage device or system according to the present invention comprises an electro-static chuck portion having a substrate-mounted face made of ceramics; a support block continuous from the bottom of the electrostatic chuck portion and made integral to the electrostatic chuck portion; an insulating section for electrically insulating the electrostatic chuck portion from other members; at least one of an electrode embedded in the electro-static chuck portion and serving to generate charge on the substrate-mounted face, when DC voltage is applied to the substrate, to attract and hold a substrate on the substrate-mounted face; and resistibility reducing material added to the ceramics to reduce resistibility of the ceramics forming the electrostatic chuck portion to remove charge from the substrate-mounted face when the substrate is to be released from the face; wherein an amount of the resistibility reducing material contained in the ceramics becomes gradually smaller as the amount of resistibility reducing material comes from the electrode nearer to the support block.

According to the stage system of the present invention, the amount of resistibility reducing materials contained in that section of the electrostatic chuck portion which is in the vicinity of the substrate-mounted face is large. When the power source is turned OFF, therefore, charge can be eliminated from the electro-static chuck portion to release the substrate from the substrate-mounted face at once.

Further, ceramics of the alumina group is selected as insulating material for the face-near section of the chuck portion even in the case of the one of the bipolar type. This can prevent leak current 15b (or current passing through not the substrate but the electrostatic chuck portion) from flowing from the plus electrode to the minus one.

On the other hand, the amount of resistibility reducing materials contained is made gradually smaller as it comes from the electrostatic chuck portion nearer to the support block. Insulation relative to high frequency can be thus fully guaranteed and power loss can be reduced.

As the above resistibility reducing material, there may used one kind or two or more kinds of semiconductors selected from a group of C, Si, W, and Wo, or metallic particles. Or, there may be used one kind or two or more kinds of oxide selected from a group of $Y_2O_3$, CaO, MgO, $Cr_2O_3$, and $SiO_2$.

The following will explain the principle why resistibility of the ceramics is reduced by added oxide materials.

First, in a case where the ceramics forming the electrostatic chuck portion is AlN, oxygen of oxide is combined with Al of the matrix so as to newly produce $Al_2O_3$ if the above oxide is added to matrix AlN. If the produced $Al_2O_3$ is solubilized in matrix AlN, a crystal dislocation is generated in the AlN matrix. By the presence of the crystal dislocation, electrical resistibility of the AlN matrix is reduced.

Next, in a case where the ceramics forming the electrostatic chuck portion is $Al_2O_3$, the density of a particle lump of $Al_2O_3$ is lowered if the above oxide is added to matrix $Al_2O_3$. Since leak current flows to bypass such a rough particle lump of $Al_2O_3$, electrical resistibility of $Al_2O_3$ matrix is reduced.

Still further, the electrostatic chuck portion and the support block are made as a unit. Local stress concentration, therefore, cannot be caused even under the thermal cycle condition to thereby prevent the electrostatic chuck portion from being broken.

Still further, it is desirable that a thin film layer of substantially pure ceramics in which no resistibility reducing material is contained is formed on the top of the electrostatic chuck portion. This pure ceramic thin film layer enables the chuck portion to be more highly insulated from plasma discharged, without disturbing the removal of remaining charge from the face.

Still further, the mixing rate of ceramics and metal contained is gradually changed as it comes from the support block nearer to the metal-made and cooling jacket-provided portion. These portions can be thus made as a unit and their manufacturing process and structure can also be made simpler.

It is noted that the metal-made and cooling jacket-provided portion is preferably made of metal having a high melting point such as Cu, W, Mo.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 shows component members dismantled, said component members forming the upper portion of the stage system;

FIG. 5 is a sectional view schematically showing the plasma CVD apparatus provided with the stage system according to a second embodiment of the present invention;

DETAILED DESCRIPTION OF THE PREFERRED EMBODIMENTS

Some preferred embodiments of the present invention will be described with reference to the accompanying drawings.

The load lock system provided with the stage system according to a first embodiment of the present invention will be described firstly with reference to FIGS. 1 through 4.

Figure 1:
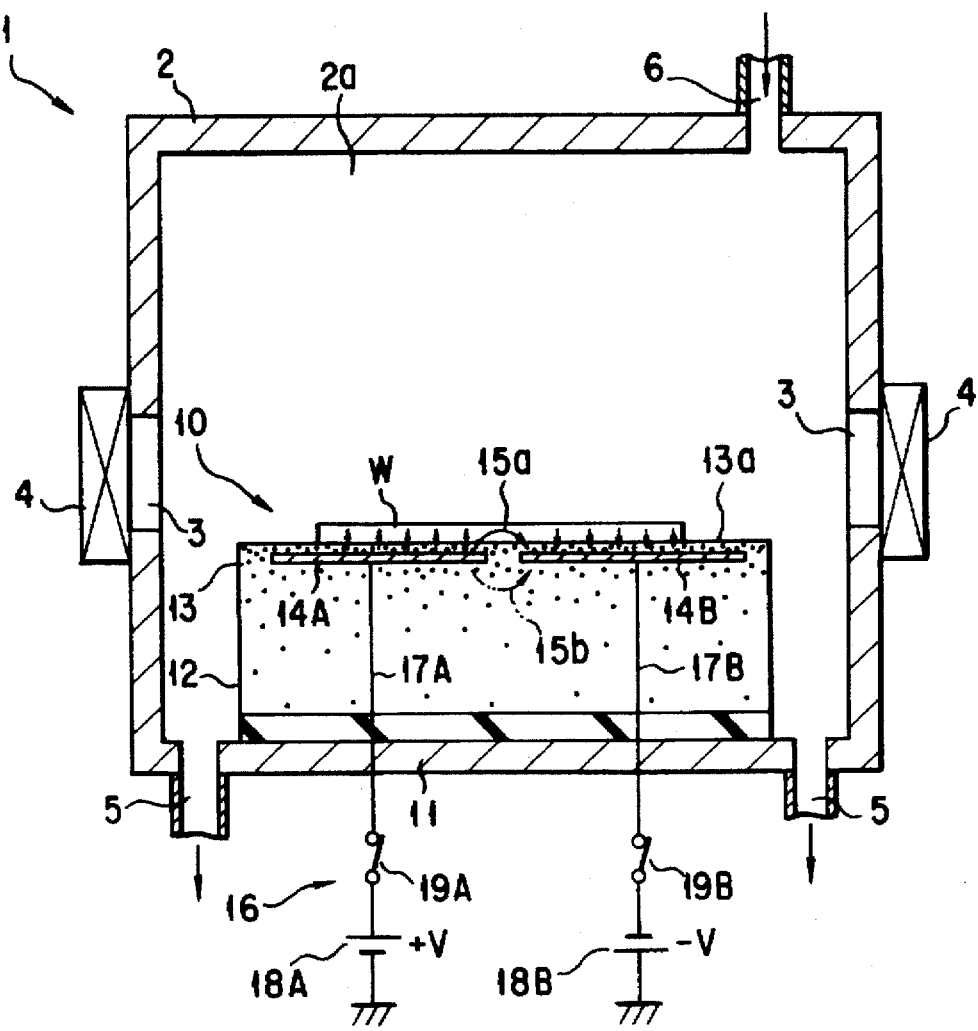
FIG. 1 is a sectional view schematically showing the load lock system provided with the stage system or device according to a first embodiment of the present invention.

As shown in FIG. 1, a stage system 10 is arranged in a chamber 2 of the load lock system. The load lock chamber 2 is made of metal material such as aluminum alloy and stainless steel and it is earthed or grounded. Exhaust passages 5 extend from its bottom while a gas supply passage 2 from its top. It can be thus exhausted through the exhaust passages 5 while gases such as nitrogen and others of the non-oxide group are supplied into it through the gas supply passage 6.

Openings 3 are formed in both sides of the chamber 2 and a gate valve 4 is attached to each of the openings 3. When the gate valve 4 is opened, a semiconductor wafer W is carried into the chamber 2 through the opening 3 by the arm mechanism (not shown) and mounted on the stage system 10.

The stage system 10 has a main portion comprising a support block 12 and an electrostatic chuck portion 13 and the support block 12 is supported by and fixed to the bottom of the chamber 2 through an insulating member 11. The electrostatic chuck portion 13 is formed on the support block 12 and the top serves as a face on which the wafer W is mounted. The electrostatic chuck portion 13 and the support block 12 are formed as a unit.

A pair of electrodes 14A and 14B each being a thin film like tungsten foil or Ag—Pd sintered sheet are embedded in the electrostatic chuck portion 13. One 14A of them is connected to the plus side of a DC power source 18A of a circuit 16 via a lead 17A and a switch 19A. The other 14B is connected to the minus side B of a DC power source 18B of the circuit 16 via a lead 17B and a switch 19B. When both of the switches 19A and 19B are turned ON, positive charge is caused by the electrode 14A while negative one by the other electrode 14B. When the wafer W is positioned above these electrodes 14A and 14B, current 15a flows between them through the wafer W, which can be thus sucked by and held on the wafer-mounted face 13a of the electrostatic chuck portion 13.

The electrostatic chuck portion 13 and the support block 12 are made as a unit by sintered alumina. To make a little conductive that insulation area of the electrostatic portion 13 which is in the vicinity of the wafer-mounted face 13a, an adequate amount of carbon particles 71 is mixed in ceramics of the alumina group in the electrostatic chuck portion 13. This conductivity in the insulation area may be such that can prevent the occurrence of remaining charge. When it is too much, power loss becomes large. The resistibility reducing materials 71 include nonmetallic ones such as silicon and carbon as well as metallic ones such as tungsten.

Moreover, as the resistibility reducing material 71, there may be used one kind or two or more kinds of oxide selected from a group of $Y_2O_3$, CaO, MgO, $Cr_2O_3$, and $SiO_2$. The following will explain the case that the matrix is AlN and the case that the matrix is $Al_2O_3$.

If oxide is added to the matrix AlN, oxygen of oxide is combined with Al of the matrix so that $Al_2O_3$ is newly produced. If the produced $Al_2O_3$ is solubilized in matrix AlN, the crystal dislocation is generated in the AlN matrix. By the presence of the crystal dislocation, electrical resistibility of the AlN matrix is reduced.

On the other hand, if oxide is added to the matrix $Al_2O_3$, the density of a particle lump of $Al_2O_3$ is lowered. Since the leak current flows to bypass such a rough particle lump of $Al_2O_3$, electrical resistibility of $Al_2O_3$ matrix is reduced.

The support block and electrostatic chuck portions 12 and 13 will be described referring to FIGS. 2 through 4.

Figure 2:
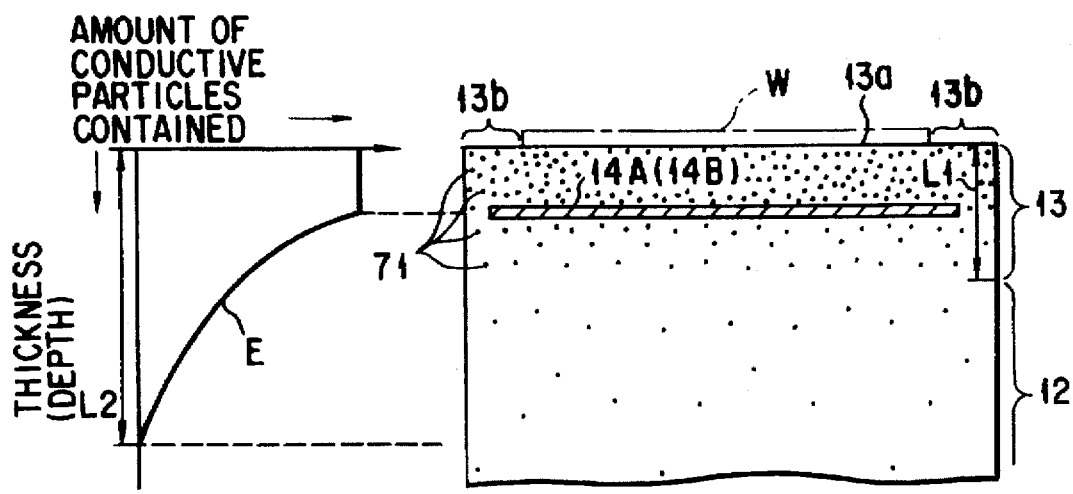
FIG. 2 is a graph showing how conductive additives are contained and distributed in the upper portion of the stage system when viewed in the thickness direction of the system.

FIG. 2 shows how resistibility reducing materials are contained and distributed in the support block and electrostatic chuck portions 12 and 13. A certain amount of resistibility reducing materials 71 is contained in that section of them which is between the substrate-mounted face 13a and the electrodes 14A, 14B. On the other hand, the amount of resistibility reducing materials 71 contained in that section of them which is below the electrodes 14A, 14B reduces gradually as shown by a curve E. When it is so arranged, a higher electrostatic suction can be achieved in a case the system is under operation and no remaining charge can be caused in another case it is not operated. In addition, power loss can be more effectively prevented.

The support block and electrostatic chuck portions 12 and 13 are made, as a unit, of ceramic material of the alumina group and their distinction is not clear but obscure. To make it easy to distinct them, however, the electrostatic chuck portion 13 has a thickness L1 of about 0.5–2.0 mm and the electrode 14 has a thickness of about 10–100 µm. A depth L2 extending from the substrate-mounted face 13a to that level in the support block portion where resistibility reducing materials 71 becomes zero is about 0.5–5 mm. When the amount of resistibility reducing materials 71 contained is changed little by little, as described above, the occurrence of large thermal stress can be prevented in the portions 12 and 13.

Referring to FIG. 3, it will be described how the support block and electrostatic chuck portions 12 and 13 are made.

Plural thin film ceramic sheets (or green sheets) 70 are laminated and the tungsten foil electrodes 14A and 14B are sandwiched between them. Each of them has a thickness L3 of 10–100 µm. This laminated matter is pressed and then sintered under a temperature of 1200°–1900° C.

The amount of resistibility reducing materials 71 contained is certain in those ceramic sheets 70 which are above the electrodes 14A, 14B. To make it zero at the depth L2 which is 1 mm from the substrate-mounted face 13a in this case, twenty ceramic sheets 70 each having a thickness of about 50 µm may be laminated. Conductive particles 71 contained and distributed can be therefore adjusted by changing the number of sheets 70 laminated or the amount of resistibility reducing materials 71 contained in each of the sheets 70.

Further, that section of the portion 12 which is below that level thereof where the amount of resistibility reducing materials 71 contained becomes zero may be made by ceramic sheets each of which is thicker than the sheet 70.

Furthermore, $Al_2O_3$ or AlN can be used as insulating material for the members 12 and 13. Or a combination of these ceramic materials may be used for this purpose. For example, $Al_2O_3$ which is more excellent particularly in durability can be used as ceramic material for that section of the portions 12, 13 which is above the electrode 14, while AlN which is more excellent in heat conductivity can be used for that section thereof which is below the electrode 14.

Still further, when both of $Al_2O_3$ and AlN are used as the insulating material, it is desirable that their mixture is used in the border of one of them relative to the other, not causing the one to quickly switch over to the other.

Figure 4:
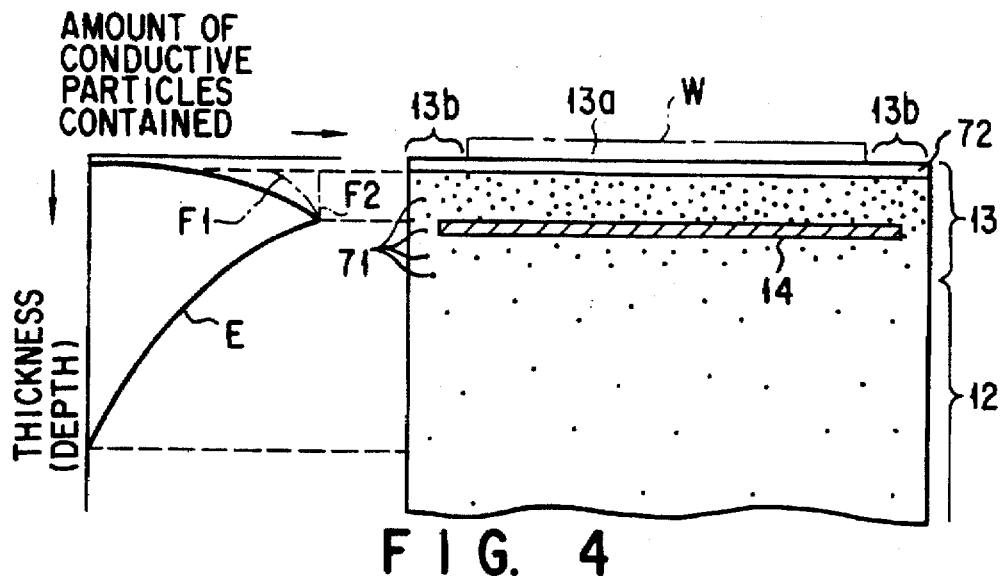
FIG. 4 is a graph showing how conductive additives are contained and distributed in the upper portion of a variation of the stage system when viewed in the thickness direction of the system.

A thin film layer 72 of pure ceramics may be formed on the top surface (or substrate-mounted face) of the electrostatic chuck portion 13, as shown in FIG. 4. This pure ceramic thin film layer 72 is extremely thin, having a thickness of 10–50 µm, and it is made of substantially pure ceramics in which few resistibility reducing materials 71 are contained.

It is preferable in this case that the amount of resistibility reducing materials 71 contained in the insulating (or ceramic) material which is between the pure ceramic thin film layer 72 and the electrode 14 increases quickly more and more as it comes from the pure ceramic thin film layer 72 nearer to the electrode 14. The pure ceramic layer 72 is extremely thin, so that thermal stress caused in it can be made extremely small. As the result, the amount of resistibility reducing materials 71 contained and distributed in that section of the portions 12, 13 which is in the vicinity of the thin film layer 72 may change gently as shown by a curve F1 or may be same as shown by a line F2.

When the pure ceramic thin film layer 72 is formed, as described above, on the top of the portions 12, 13, electrostatic suction can be kept unchanged even when the system is under operation. In addition, no charge remains on the substrate-mounted face 13a when the system is left inoperative. This can effectively prevent film from being stuck and formed on that rim portion 13b of the substrate-mounted face which is not overlapped by the wafer W.

In the case of the electrostatic chuck portion 13 shown in FIG. 2, the chuck surface (or substrate-mounted face) 13a has quite small conductivity. When high frequency is applied to it, therefore, power loss is caused at the rim portion 13b, while forming a DC circuit coupled with discharge plasma. Further, the drawing of active species and plasma toward the rim portion 13b becomes so strong that density film such as $SiO_2$ can be stuck and formed on the rim portion 13b. This density $SiO_2$ film cannot be removed by usual cleaning operation.

A second embodiment of the present invention will be described with reference to FIGS. 5 through 8. A stage device or system of the plasma CVD apparatus will be described as the second embodiment in this case. Same components as those of the first embodiment will be mentioned only when needed.

As shown in FIG. 5, a chamber 22 of the plasma CVD apparatus 24 has a ceiling, side walls and a bottom made of conductive matter such as aluminum alloy, for example. An upper electrode 84 and a lower electrode (or stage system) 26 are opposed to each other in it. The stage system 26 has a substrate-mounted face made of heat-conductive ceramics. Its electrostatic chuck and support block portions 58 and 60 are made as a unit. It is mounted on a member 62, which is provided with a cooling jacket 88, through O-rings 81. Heat-conductive gas such as helium is supplied into a clearance between the support block 60 and the member 62 to keep their heat conductivity excellent. An insulating member 28 is interposed between the cooling-jacket-provided member 62 and the chamber 22.

The electrostatic chuck portion 58 is formed at the top of the stage system 26. It is of the single-pole type, having an electrode 14, which is connected to DC and high frequency power sources 18 and 20. The high frequency power source 20 serves to apply bias voltage to the electrode 14 to effectively draw active species from discharge plasma.

A plasma-creating high frequency power source 22 is connected to the upper electrode 84, which is supported in the upper portion of the chamber 22 by an insulating support member 30. A feeder line 32 extending from the upper electrode 84 is connected to the high frequency power source 22 of 13.5 MHz through a matching circuit 34.

A gate valve 34 is formed in a side wall of the chamber 22 and the wafer W is carried into and out of the chamber 22 through the gate valve 34. Two nozzles 36 and 38 are passed through another opposite side wall of the chamber 22. The first nozzle 36 is communicated with a gas supply source 46 by a pipe 40 through a mass flow controller 42 and a switch valve 44. Plasma-generating gas such as argon is contained in the gas supply source 46. The second nozzle 38 is communicated with a gas supply source 54 by a pipe 48 through a mass flow controller 50 and a switch valve 52. Process gas is contained in the gas supply source 54. The chamber 22 is exhausted through plural exhausting openings 56 in the bottom thereof.

The electrode 14 made of tungsten foil is embedded in the electrostatic chuck portion 58. A lead 64 extending from the electrode 14 is connected to the high frequency bias power source 20 through a matching box 66. The other branching lead 64 is connected to the DC power source 18, which serves for the electrostatic chuck, through a low-pass filter 67 and a change-over switch 68.

The electrostatic chuck and support block portions 58 and 60 are formed as a unit and resistibility reducing materials 71 such as carbon and silicon are mixed in the ceramic material, of which the electrostatic chuck portion 58 is made, to make the portion 58 a little conductive.

The amount of resistibility reducing materials 71 contained and distributed in the case of the second stage system 26 is substantially same as that in the first one.

Figure 6:
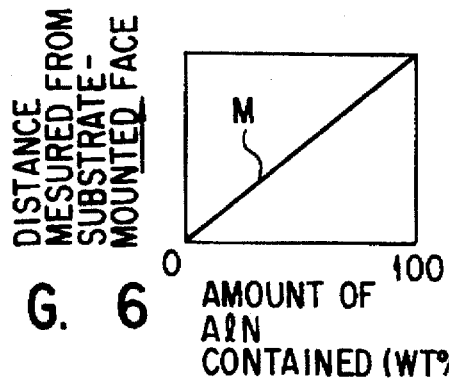
FIG. 6 shows how metal particles are contained and distributed in the electrostatic chuck and substrate-mounted portion of the stage system when viewed in the thickness direction of it.
Figure 7:
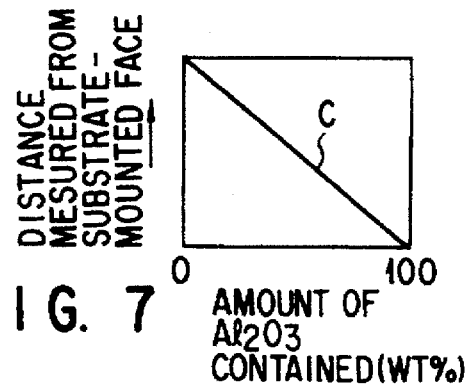
FIG. 7 shows how ceramic particles are contained and distributed in the electrostatic chuck and substrate-mounted portion of the stage system when viewed in the thickness direction of it.

As shown by a line M in FIG. 6, the amount of AlN contained is increased in the support block 60 as it comes remoter from the substrate-mounted face 13a. On the other hand, the amount of $Al_2O_3$ contained is gradually reduced in the support block 60, as shown by a line C in FIG. 7, as it comes remoter from the substrate-mounted face 13a.

It will be described how the second stage system is operated.

The semiconductor wafer W is carried into the process chamber 22 through the gate valve 34 by a carrier arm (not shown) and it is mounted on the substrate-mounted face of the electrostatic chuck portion 58 while moving a lifter pin (not shown) up and down. DC voltage is applied to the electrode 14 to generate charge in the substrate-mounted face of the electrostatic chuck portion 58, thereby enabling the wafer W to be sucked and held on the substrate-mounted face.

A predetermined process pressure is kept in the process chamber 22 while introducing argon and process gases into it. High frequency voltage is applied to the upper electrode 84 at the same time to generate plasma in a process space 22a, so that the wafer W can be CVD-processed.

When these steps are repeated, the stage system 26 is subjected to thermal cycle. No concentration of a large local stress, however, is caused in the electrostatic chuck and support block portions 58 and 60. This can effectively prevent them from being broken.

Further, that section of the electrostatic chuck and support block portions 58 and 60 in which resistibility reducing materials 71 are contained has a thickness of 0.5–5 mm. The insulation of the whole support block 60 from high frequency can be thus fully guaranteed, thereby preventing power loss from becoming large.

When the electrostatic chuck and support block portions 58 and 60 are made as a unit by two kinds of ceramic material, their mixing rate is gradually changed in the border of one of them relative to the other. When it is so arranged, internal stress can be more reduced.

When the electrostatic chuck and support block portions 58 and 60 are formed as a unit, the stage system can be made simpler in structure and the number of parts or components used can be made smaller.

Figure 8:
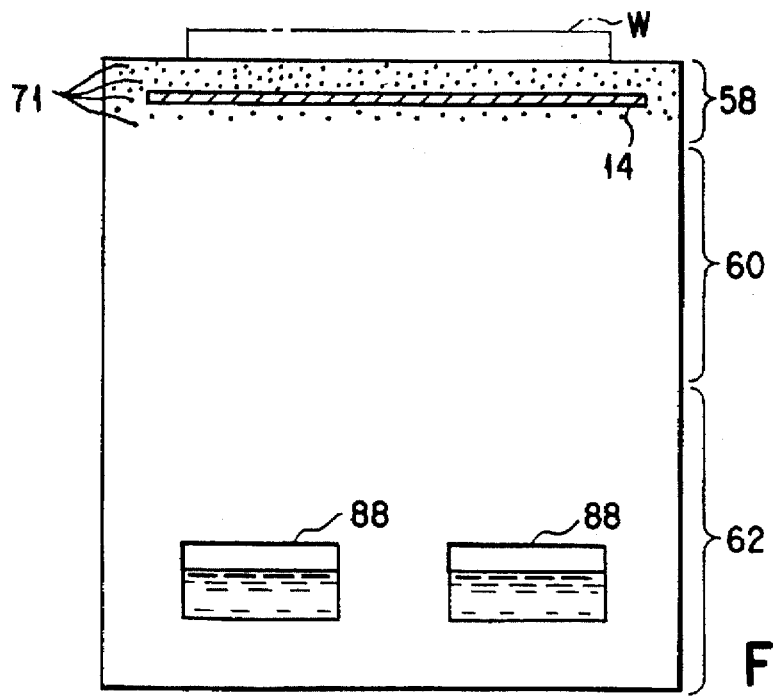
FIG. 8 is a sectional view schematically showing a main portion of the other stage system.

As shown in FIG. 8, the support block 60 and the cooling jacket 62 may be formed as a unit. The cooling jacket 62 is made, in this case, of copper (Cu) instead of aluminum. In addition, the mixing rate of ceramics and copper is more gradually changed when it comes from the support block 60 nearer to the cooling jacket 62 in the thickness direction of the unit. When it is so arranged, the number of components used can be still further reduced. Heat resistance can also be made smaller in the thickness direction of the unit. The efficiency of cooling the wafer W can be thus increased.

Metal material is not limited to copper but any metal materials which are more or less durable against the temperature (or about 1200° C.), under which the ceramics are sintered, can be used.

If the cooling jacket 62 is made of metal which may fail to withstand the plasma, it is desirable that the jacket 62 be coated with a thing film of $Al_2O_3$ or AlN.

The insulating material for the electrostatic chuck portion and others is not limited to $Al_2O_3$ and AlN but other ceramics such as SiN may be used.

Although the above-described second embodiment has been applied to the plasma CVD apparatus, it may also be applied to other plasma process apparatus such as plasma etching and ashing ones.

According to the present invention, the electrostatic chuck portion and the support block can be formed as a unit.

Internal stress which is caused by the thermal expansion difference of one component relative to the other can be thus reduced, thereby enabling the durability of the stage system to be increased to a greater extent. In addition, the number of components used can be made smaller when both of the electrostatic chuck portion and the support block are formed as a unit.

Further, the amount of resistibility reducing materials contained in the ceramics is changed little by little in the thick direction of the unit. Electrostatic suction can be thus kept unchanged and charge can be more quickly removed from the substrate-mounted face of the unit after the power is turned OFF.

Still further, the insulation of the substrate-mounted face can be increased not to cause the face to be coupled with plasma, when the pure ceramic thin film layer is formed to serve as the substrate-mounted face. Power loss can be thus reduced and the adhering of product, so dense as not to be removed by the usual cleaning operation, to the face can be prevented.

Still further, when the cooling jacket portion is also made integral to the support block, the stage system can be made simpler in construction and the whole of it can be made by a single process.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A stage device or system comprising;
   an electrostatic chuck portion having a substrate-mounted face made of ceramics;
   a support block continuous from the bottom of the electrostatic chuck portion and made integral to the electrostatic chuck portion;
   an insulating section for electrically insulating the electrostatic chuck portion from other members;
   at least one of an electrode embedded in the electrostatic chuck portion and serving to generate charge on the substrate-mounted face, when DC voltage is applied to the electrode, to attract and hold a substrate on the face; and
   resistibility reducing material added to the ceramics to reduce resistibility of the ceramics forming the electrostatic chuck portion to remove charge from the substrate-mounted face when the substrate is to be released from the face;
   wherein an amount of resistibility reducing materials contained in the ceramics becomes gradually smaller and smaller as the amount of resistibility reducing materials comes from the electrode nearer to the support block.

2. The stage system according to claim 1, wherein the amount of resistibility reducing materials contained in that section of the electrostatic chuck portion which is between the substrate-mounted face and the electrode is larger than that in this section of the support block which is below the electrode.

3. The stage system according to claim 1, wherein the substrate-mounted face is made by a thin film of pure ceramics in which no resistibility reducing material is substantially contained.

4. The stage system according to claim 3, wherein the amount of resistibility reducing materials contained becomes gradually larger and larger as the amount of resistibility reducing materials comes from the pure ceramic thin film nearer to the electrode.

5. The stage system according to claim 1, wherein the electrostatic chuck portion is made of at least one kind of ceramics selected from the group consisting of aluminum oxide and aluminum nitride.

6. The stage system according to claim 1, wherein the electrostatic chuck portion and the support block are made of at least one kind of ceramics selected from the group consisting of aluminum oxide and aluminum nitride.

7. The stage system according to claim 5 or 6, wherein that section of the electrostatic chuck portion which is above the electrode is made of aluminum oxide ceramics and/or aluminum nitride ceramics, and this section of the electrostatic chuck portion and the support block which is below the electrode is made of the aluminum nitride ceramics.

8. The stage system according to claim 5 or 6, wherein the amount of aluminum oxide contained becomes gradually smaller while the amount of aluminum nitride contained becomes gradually larger as it comes from the substrate-mounted face nearer to the support block.

9. The stage system according to claim 1, further comprising a support block arranged on a metal-made and cooling-jacket-provided block, wherein the substrate-mounted face and the cooling-jacket-provided block are made as a unit together with the support block while gradually changing the mixing rate of ceramics and metal contained as it comes from the face nearer to the cooling-jacket-provided block.

10. The stage system according to claim 9, wherein the cooling-jacket provided block is formed of copper.

11. The stage system according to claim 9, wherein the amount of metal contained becomes gradually larger while the amount of ceramics contained becomes gradually smaller as the amount of ceramics comes from the electrode nearer to the support block.

12. The stage system according to claim 9, wherein that level in the support or cooling-jacket-provided block at which the amount of resistibility reducing materials contained becomes zero is 0.5–5 mm in the thickness direction of the block when measured from the substrate-mounted face.

13. The stage system according to claim 1, wherein the electrostatic chuck portion is made of a main matter such as aluminum oxide ceramics or aluminum nitride ceramics, and an electrode is embedded in said electrostatic chuck portion.

14. The stage system according to claim 1, wherein the electrostatic chuck portion is made of a main matter such as aluminum nitride ceramics, and two electrodes are embedded in said electrostatic chuck portion.

15. The stage system according to claim 1, wherein said resistibility reducing materials are selected from the group consisting of semiconductor or metal.

16. The stage system according to claim 14, wherein the resistibility reducing material is formed of one or two or more semiconductors or metallic particles selected from a group of carbon, silicon, tungsten and molybdenum.

17. The stage system according to claim 14, wherein the resistibility reducing material is formed of one or two or more oxide selected from a group of $Y_2O_3$, $CaO$, $MgO$, $Cr_2O_3$, and $SiO_2$.

18. The stage system according to claim 1, wherein the electrostatic chuck portion has a thickness ranging from 0.5 mm to 2 mm.

19. The stage system according to claim 1, wherein the electrode is made of tungsten foil, 10–100 μm thick.

20. The stage system according to claim 1, wherein the electrostatic chuck portion and the support block are made as a unit by putting plural ceramic green sheets having a thickness of 10–100 μm on a ceramic block and sintering them at a temperature range of 1200°–1900° C. while pressing them.

21. A system for processing a substrate in a decompressed atmosphere, said system including a vacuum chamber within which a decompressed atmosphere is maintained, and a stage device for electrostatically attracting and holding a substrate in the decompressed atmosphere, and wherein said stage device comprises:

- an electrostatic chuck portion having a substrate-mounted face made of ceramics;
- a support block continuous from the bottom of the electrostatic chuck portion and made integral to the electrostatic chuck portion;
- an insulating section for electrically insulating the electrostatic chuck portion from other members;
- at least one of an electrode embedded in the electrostatic chuck portion and serving to generate charge on the substrate-mounted face, when DC voltage is applied to the electrode, to attract and hold a substrate on the face; and
- resistibility reducing material added to the ceramics to reduce resistibility of the ceramics forming the electrostatic chuck portion to remove charge from the substrate-mounted face when the substrate is to be released from the face;
- wherein an amount of resistibility reducing materials contained in the ceramics becomes gradually smaller as the amount of resistibility reducing materials comes from the electrode nearer to the support block.

22. A plasma processing system for processing a substrate with a plasma, said system including a plasma processing chamber within which a substrate is processed utilizing a plasma, and wherein said system further includes a stage device for electrostatically attracting and holding a substrate during plasma processing, and wherein said stage device comprises: p1 an electrostatic chuck portion having a substrate-mounted face made of ceramics;

- a support block continuous from the bottom of the electrostatic chuck portion and made integral to the electrostatic chuck portion;
- an insulating section for electrically insulating the electrostatic chuck portion from other members;
- at least one of an electrode embedded in the electrostatic chuck portion and serving to generate charge on the substrate-mounted face, when DC voltage is applied to the electrode, to attract and hold a substrate on the face; and
- resistibility reducing material added to the ceramics to reduce resistibility of the ceramics forming the electrostatic chuck portion to remove charge from the substrate-mounted face when the substrate is to be released from the face;
- wherein an amount of resistibility reducing materials contained in the ceramics becomes gradually smaller as the amount of resistibility reducing materials comes from the electrode nearer to the support block.

* * * * *